United States Patent [19]

Wright

[11] Patent Number: 5,014,418
[45] Date of Patent: May 14, 1991

[54] METHOD OF FORMING A TWO PIECE CHIP CARRIER

[75] Inventor: John O. Wright, Warren, Pa.

[73] Assignee: GTE Products Corporation, Stamford, Conn.

[21] Appl. No.: 536,363

[22] Filed: Jun. 11, 1990

Related U.S. Application Data

[62] Division of Ser. No. 381,622, Jul. 13, 1989.

[51] Int. Cl.$^5$ .............................................. H01R 43/00
[52] U.S. Cl. ..................................... 29/827; 156/330; 375/70; 437/217; 437/221
[58] Field of Search ................... 29/827; 437/219, 217, 437/220, 221, 209; 156/330; 357/70

[56] References Cited

U.S. PATENT DOCUMENTS

| | | | |
|---|---|---|---|
| 3,404,215 | 10/1968 | Barks et al. | 174/52 |
| 3,469,953 | 9/1969 | St. Clair et al. | 29/193.5 |
| 3,537,175 | 11/1970 | St. Clair et al. | |
| 3,660,819 | 5/1972 | Frohman-Bentchkowsky | |
| 3,750,277 | 8/1973 | Happ | |
| 3,874,549 | 4/1975 | Hascoe | 220/200 |
| 3,943,623 | 3/1976 | Mizutani et al. | |
| 4,025,716 | 5/1977 | Morse | 174/52.4 |
| 4,105,861 | 8/1978 | Hascoe | 174/52 FP |
| 4,135,038 | 1/1979 | Takami et al. | 428/427 |
| 4,137,546 | 1/1979 | Frusco | 357/70 |
| 4,204,317 | 5/1980 | Winn | 29/827 |
| 4,326,214 | 4/1982 | Trueblood | 357/74 |
| 4,635,165 | 1/1987 | Okuaki | 361/400 |
| 4,663,650 | 5/1987 | Gilder, Jr. et al. | 357/70 |
| 4,663,651 | 5/1987 | Gilder, Jr. et al. | 357/70 |
| 4,691,225 | 9/1987 | Murakami et al. | 357/80 |
| 4,709,122 | 11/1987 | Samuels | 174/52.4 |
| 4,727,221 | 2/1988 | Saltou et al. | 174/52 FP |
| 4,744,009 | 5/1988 | Grabbe et al. | 361/398 |

OTHER PUBLICATIONS

IBM Tech. Disclosure Bulletin, L. V. Avletta, vol. 17, No. 3, Aug. 1974, pp. 649–650.

Primary Examiner—Carl J. Arbes
Attorney, Agent, or Firm—William H. McNeill

[57] ABSTRACT

A hermetically sealed chip carrier including a lead frame for use with an EEPROM chip, the carrier including a pre-molded plastic base and a metal cover having an aperture into which has been poured an ultraviolet glass window.

2 Claims, 1 Drawing Sheet

METHOD OF FORMING A TWO PIECE CHIP CARRIER

This is a division of copending application Ser. No. 07/381,622, filed on Jul. 13, 1989.

BACKGROUND OF THE INVENTION

1. Field of the Invention

This invention relates to a hermetically sealed chip carrier including a lead frame for use with an electrically erasable programmable read only memory (EEPROM) chip.

2. Description of the Prior Art

The manufacture of lead frames is disclosed in, for example, U.S. Pat. Nos. 4,204,317; 4,137,546; 3,750,277; 3,537,175; and 3,469,953. Typically a chip is mounted on a lead frame, electrically connected to the leads thereof, and packaged. Examples of such structure are described in U.S. Pat. Nos. 4,744,009; 4,727,221; 4,691,225; 4,663,651; 4,663,650; 4,635,165; 4,326,214; 4,135,038; 4,105,861; 3,943,623; 3,874,549; 3,660,819 and 3,404,215.

Typically, an EEPROM chip is packaged in a hermetically sealed ceramic package, known in the art as a "CERDIP" package, which incorporates an ultra violet (UV) transparent glass or quartz window. In the manufacture of such structures relatively high temperatures are required in the sealing operation and this results in reduced yields. Such a ceramic package tends to be inherently expensive. In addition, typical transparent covers heretofore used in CERDIP packages have been quartz in ceramic, which is expensive. Further, the use of ceramic covers has inhibited variation in size and shape of the window, the traditional window being formed from extruded quartz bars which are sliced for use in the ceramic cover.

It is an object of this invention to produce an EEPROM chip carrier which can be hermetically sealed to relatively low temperatures thereby increasing yields and reducing costs. A further object is to provide an EEPROM chip carrier using materials which are less expensive and easier to work than ceramic. It is also an object to provide an EEPROM carrier the UV transparent window of which can be readily varied in size and shape to accommodate any chip such as, for example, the relatively larger chips presently being used.

SUMMARY OF THE INVENTION

This invention achieves these and other objects by providing a hermetically sealed chip carrier, and method of forming same, comprising a pre-molded base comprising thermosetting plastic and including a recesed portion bounded by a first peripheral wall. A first epoxy B-stage preform is also provided having a first surface which engages the base and is adhered thereto, and an opposite second surface. The first epoxy B-stage preform includes an open area through which the first peripheral wall extends, and a die pad engaging area within the open area. A lead frame is provided having a first side which engages the opposite second surface and is adhered thereto, and an opposite second side. The lead frame includes a die pad adjacent the open area and adhered to the opposite second surface at the die pad engaging area. A chip is provided having a first area which engages the die pad and an opposite second area, the chip being electrically connected to the lead frame strip. A second epoxy B-stage preform is provided having a lower surface which engages the lead frame strip and is adhered thereto, and an opposite upper surface. The second epoxy B-stage preform includes a peripheral edge portion and an open central portion. A metal cover is bonded to the pre-molded base and electrically insulated from the lead frame strip by the peripheral edge portion, the metal cover having an aperture therethrough adjacent the chip. A prepoured ultra-violet glass window encloses the aperture. Means associated with the pre-molded base and the lead frame is also provided for aligning the lead frame relative to the pre-molded base.

DESCRIPTION OF THE PREFERRED EMBODIMENT

Figures 1, 2:
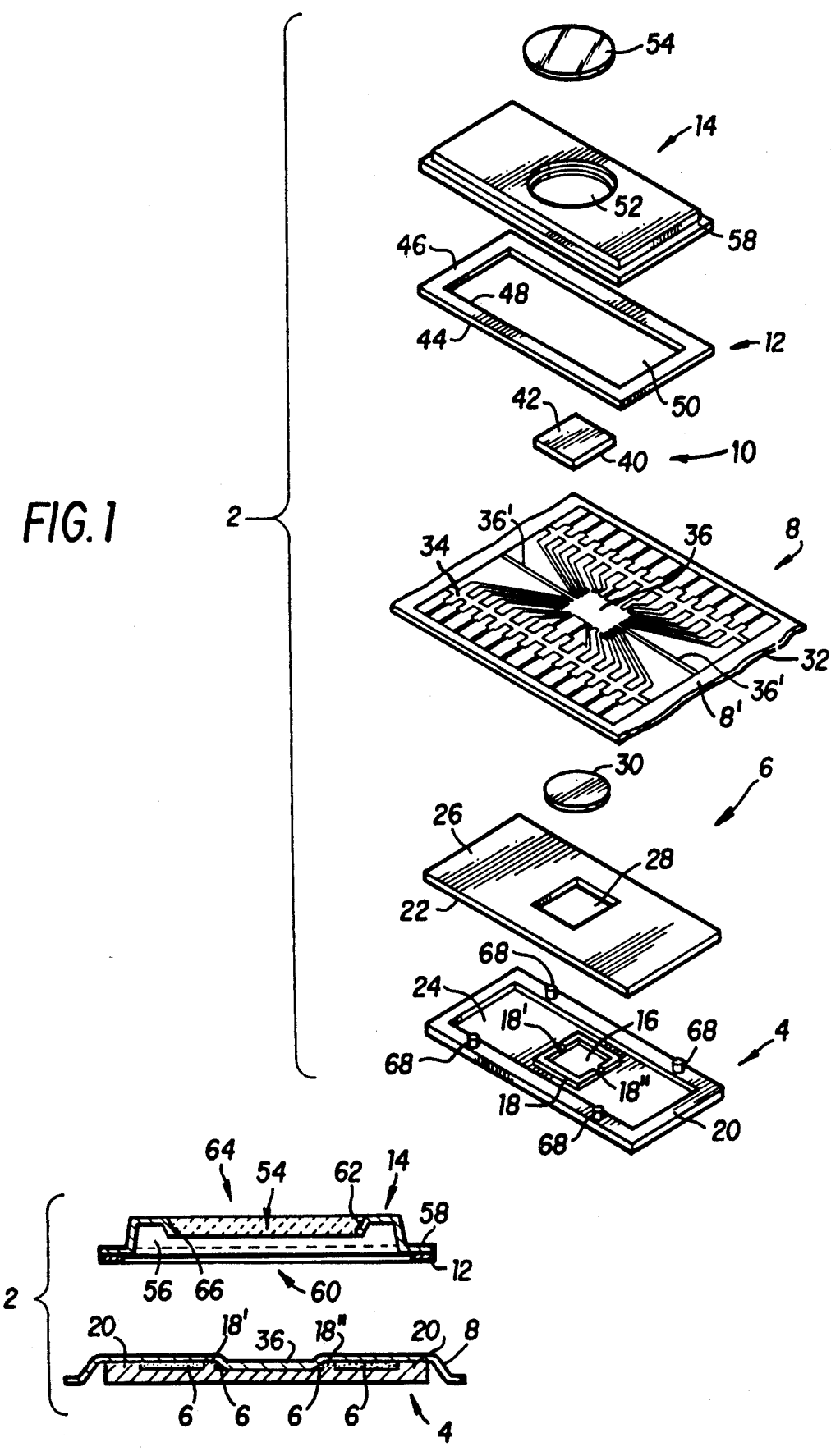
FIG. 1 is a partially cut away exploded view representing a chip carrier of the present invention.
FIG. 2 is an exploded view of the chip carrier of the present invention partially assembled.

The embodiment which is illustrated in the drawings is particularly suited for achieving the objects of this invention. FIG. 1 depicts an exploded view of a hermetically sealed chip carrier 2 which includes a base 4, first epoxy B-stage preform 6, lead frame 8, chip 10, second epoxy B-stage preform 12 and cover 14.

In the preferred embodiment base 4 is molded in a known manner using thermosetting plastic to form a pre-molded base. Examples of such a thermosetting plastic are known epoxy molding compounds made by Nitto, Hysol and others. However, preferably the base is molded using a thermoplastic material such as ULTEM which is a trademark of General Electric Company. Pre-molded base 4 includes a recessed portion 16 bounded by a first peripheral wall 18 having slots 18' and 18". A second peripheral wall 20 extends about the periphery of the pre-molded base 4. Peripheral walls 18 and 20 are preferably molded integrally with the base 4.

The first epoxy B-stage preform 6 includes a first surface 22 which engages the base 4 at surfae 24, and an opposite second surface 26. The preform 6 also includes an open area 28 through which wall 18 extends, and a separate die pad engaging member 30 within the open area 28. The first surface 22 and the die pad member 30 are adhered to the surface 24 and recessed portion 16, respectively, of the base 4 as explained herein. Preform 6 can be formed from any of many well-known B-stage epoxy materials such as, without limitation, TE-150 made by Amicon.

The lead frame 8 is well-known in the art and will not be described in detail herein except to note that typically it is stamped from a metal strip formed of copper alloys and includes leads, the inner ends of which are eventually electrically connected to an EEPROM chip such as chip 10 in a known manner, the lead frame being held together by supports 8'. Lead frame 8 includes a first side 32 which engages surface 26 of the preform 6 and is adhered thereto as described herein, and an opposite second side 34. Lead frame strip 8 also includes a slightly depressed die pad 36 mounted to the lead frame supports by ribs 36'. Die pad 36 is adjacent the open area 28, and adhered to the recessed portion 16 by member 30, ribs 36' extending through slots 18' and 18".

In the preferred embodiment, the lead frame is a phosphor bronze material plated and/or provided with an inlay of silver, gold or aluminum, all as is known in the art, and includes leads electrically connected to EEPROM chip 10 in a known manner. Chip 10 includes a first area 40 which engages the inlay 36 and an opposite second area 42.

A second epoxy B-stage preform 12 is provided. Preform 12 includes a lower surface 44, which engages the surface 34 of the lead frame and is adhered thereto as described herein, and an opposite upper surface 46. Preform 12 is formed by a peripheral edge portion 48 and an open central portion 50. As in the case of preform 6, preform 12 can be formed from any of many well-known B-stage epoxy materials such as, for example, those noted above with respect to preform 6.

A cover 14 is provided to complete the assembly. Cover 14 is metal such as metal alloys produced under the trademarks Kovar or Rodar, or other metals used in glass/metal seals. Cover 14 is bonded to the pre-molded base 4 and electrically insulated from the lead frame strip 8 by the peripheral edge portion 48 of the preform 12 as described herein. Metal cover 14 includes an aperture 52 therethrough adjacent the second area 42 of EEPROM chip 10. A pre-poured ultra-violet glass window 54 encloses aperture 52. In the preferred embodiment the metal cover 14 includes a first central recessed area 56 and a peripheral flanged area 58, the metal cover being bonded to the pre-molded plastic base by bonding the peripheral flanged area 58 of the cover to the peripheral wall 20 of the base as described herein. Preferably the thermal coefficient of the metal cover 14 and glass window 54 are the same.

As depicted in FIG. 2, the first central recessed area 56 of the metal cover 14 extends into the metal cover from one side 60. In the preferred embodiment, the aperture 52 is bounded by a second recessed area 62 which extends into the metal cover 14 from an opposite side 64, and the second recessed area 62 includes a peripheral radial flange 66. In this embodiment, the pre-poured ultra-violet glass window 54 encloses the aperture 52 by being sealed to the second recessed area 62 and peripheral flange 66. Preferably, metal cover 14 is a stamped structure.

Means associated with the pre-molded base 4 is provided for properly aligning the lead frame 8 during assembly. For example, a plurality of proturberances 68 extend from the pre-molded base 4 and extend between various leads of the lead frame 8. Preferably, the height of the protuberances 68 will be equal to the thickness of the lead frame 8.

The carrier of the present invention can be hermetically sealed at low temperatures thereby increasing yields and reducing cost relative to ceramic carriers, and the materials used are less expensive and easier to work than ceramic. In addition, the pre-poured window can be readily varied in size and shape to accommodate the larger chip used today. In use, the chip carrier can be produced as a completed unit having a chip hermetically sealed therein, or can be produced in such a manner that a customer of the chip carrier can insert whatever chip is desired and then seal the chip carrier to effect the hermetically sealed structure. For example, the chip carrier can be produced comprising a first sub-component in the form of the pre-molded base with the first epoxy B-stage preform and lead frame strip adhered thereto and a second sub-component in the form of the metal cover with the second epoxy B-stage preform adhered thereto. The first and second sub-components are shipped to the customer who attaches the desired chip to the lead frame and adheres the metal cover to the pre-molded base.

Regardless of where the device is assembled, the method includes the step of forming a first sub-assembly by (a) adhering a first surface of a first epoxy B-stage preform to a pre-molded plastic base by heating to a first predetermined temperature sufficient to cause the adhering without curing the first epoxy B-stage preform, and (b) adhering a lead frame to the pre-molded plastic base by clamping the lead frame to the pre-molded plastic base at an opposite second surface of the first epoxy B-stage preformm and heating to a second predetermined temperature sufficient to cause the adhering and cure the first epoxy B-stage preform. For example, when the base is a thermoplastic such as is produced under the General Electric Company trademark ULTEM and the first epoxy preform is TE-150, the first epoxy preform is adhered to the base at a first pre-determined temperature of less than 100° C. for about ten (10) minutes and the lead frame is adhered to the base and cured at a second predetermined temperature of about 150° C. for about one (1) hour. Upon completion of this step the lead frame will rest upon the wall 18 and the wall 20, the die pad will reside in the recess portion 16, and the cured first epoxy B-stage preform will have flowed upon surfaces 16 and 24 and between the lead frame fingers. This is generally depicted in FIG. 2. The base with lead frame can be formed as a single unit. Alternatively, a plurality of bases with respective lead frames associated therewith can be formed in a continuous process in the form of a flat strip or a strip which has been rolled into a reel. In other words, a strip of lead frames can be attached to a strip of pre-molded bases as discussed above and shipped to a customer who can cut individual base/lead frames therefrom as desired.

A second sub-assembly is then formed by adhering an upper surface of a second epoxy B-stage preform to a metal cover, having an aperture therein enclosed by a pre-poured ultra-violet glass window, by heating to a third predetermined temperature sufficient to cause the adhering without curing the second epoxy B-stage preform. When the cover is a metal alloy such as produced under the trademark KOVAR or RADAR and the second epoxy preform is TE-150 the second epoxy preform is adhered to the cover at a third predetermined temperature of less than 100° C. for about ten (10) minutes. The cover 14 with preform 12 is depicted in FIG. 2.

The chip 10 is then adhered to a die pad of the lead frame and electrically coupled to the lead frame in a known manner. Finally, the assembly is completed by adhering the first sub-assembly to the second sub-assembly by clamping the first sub-assembly to the second sub-assembly and heating to a fourth predetermined temperature sufficient to cause the adhering and cure the second epoxy B-stage preform. The fourth predetermined temperature will be about 150° C. for about one (1) hour.

The embodiments which have been described herein are but some of several which utilize this invention and are set forth here by way of illustration but not of limitation. It is apparent that many other embodiments which will be readily apparent to those skilled in the art may be made without departing materially from the spirit and scope of this invention.

I claim:

1. A method of forming a two-piece chip carrier for hermetically sealing a chip therein by adhering a chip to a die pad of a lead frame which forms part of one-piece of said chip carrier and electrically coupling said chip to said lead frame, clamping said one-piece of said chip carrier to a second-piece of said chip carrier, and heating to a predetermined curing temperature, comprising the steps of:

forming said one-piece of said chip carrier by (a) adhering a first surface of a first epoxy B-stage preform to a pre-molded plastic base by heating to a first predetermined temperature sufficient to cause said adhering without curing said first epoxy B-stage preform, and (b) adhering said lead frame to said pre-molded plastic base by clamping said lead frame to said pre-molded plastic base at an opposite second surface of said first epoxy B-stage preform and heating to a second predetermined temperature sufficient to cause said adhering and cure said first epoxy B-stage preform; and forming said second-piece of said chip carrier by adhering a first surface of a second epoxy B-stage preform, having said predetermined curing temperature, to a metal cover, having an aperture therein closed by a pre-poured ultra-violet glass window, by heating to a third predetermined temperature sufficient to cause said adhering without curing said second epoxy B-stage preform.

2. A method of forming a hermetically sealed chip carrier, comprising the steps of;

forming a first sub-assembly by (a) adhering a first surface of a first epoxy B-stage preform to a pre-molded plastic base by heating to a first predetermined temperature sufficient to cause said adhering without curing said first epoxy B-stage preform, and (b) adhering a lead frame to said pre-molded plastic base by clamping said lead frame to said pre-molded plastic base at an opposite second surface of said first epoxy B-stage preform and heating to a second predetermined temperature sufficient to cause said adhering and cure said first epoxy B-stage preform;

forming a second sub-assembly by adhering a first surface of a second epoxy B-stage preform to a metal cover, having an aperture therein closed by a pre-poured ultra-violet glass window, by heating to a third predetermined temperature sufficient to cause said ahering without curing said second epoxy B-stage preform;

adhering a chip to a die pad of said lead frame and electrically coupling said chip to said lead frame; and adhering said first sub-assembly to said second sub-assembly by clamping said first sub-assembly to said second sub-assembly and heating to a fourth predetermined temperature sufficient to cause said adhering and cure said second epoxy B-stage preform.

* * * * *